United States Patent [19]
Arndt et al.

[11] Patent Number: 5,939,335
[45] Date of Patent: Aug. 17, 1999

[54] METHOD FOR REDUCING STRESS IN THE METALLIZATION OF AN INTEGRATED CIRCUIT

[75] Inventors: Kenneth C. Arndt, Wappingers Falls; Richard A. Conti, Mt. Kisco; David M. Dobuzinsky, Hopewell Junction; Laertis Economikos, Wappingers Falls, all of N.Y.; Jeffrey P. Gambino, Gaylordsville, Conn.; Peter D. Hoh; Chandrasekhar Narayan, both of Hopewell Junction, N.Y.

[73] Assignee: International Business Machines Corporation, Armonk, N.Y.

[21] Appl. No.: 09/003,107

[22] Filed: Jan. 6, 1998

[51] Int. Cl.⁶ ...................... H01L 21/3065; H01L 21/336
[52] U.S. Cl. .................. 438/696; 438/700; 438/710; 438/714
[58] Field of Search .................................. 438/696, 700, 438/710, 714

[56] References Cited

U.S. PATENT DOCUMENTS

| | | | |
|---|---|---|---|
| 4,729,815 | 3/1988 | Leung | 438/714 |
| 4,981,551 | 1/1991 | Palmour | 438/712 |
| 5,106,770 | 4/1992 | Bulat et al. | 438/193 |
| 5,317,193 | 5/1994 | Watanabe | 257/774 |
| 5,416,048 | 5/1995 | Blalock et al. | 438/695 |
| 5,489,548 | 2/1996 | Nishioka et al. | 438/396 |
| 5,514,624 | 5/1996 | Morozumi | 438/624 |
| 5,830,797 | 11/1998 | Cleeves | 438/296 |

*Primary Examiner*—Felisa Hiteshew
*Assistant Examiner*—Donald L. Champagne
*Attorney, Agent, or Firm*—Ratner & Prestia; Steven Capella

[57] ABSTRACT

The stresses commonly induced in the dielectrics of integrated circuits manufactured using metal patterning methods, such as reactive ion etching (RIE) and damascene techniques, can be reduced by rounding the lower corners associated with the features which are formed as part of the integrated circuit (e.g., the interconnects) before applying the outer (i.e., passivation) layer. In connection with the formation of metal lines patterned by a metal RIE process, such corner rounding can be achieved using a two-step metal etching process including a first step which produces a vertical sidewall and a second step which tapers lower portions of the vertical sidewall or which produces a tapered spacer along the lower portions of the vertical sidewall. This results in a rounded bottom corner which improves the step coverage of the overlying dielectric, in turn eliminating the potential for cracks. For metal lines patterned by damascene, such corner rounding can be achieved using a two-step trench etching process including a first step which produces a vertical sidewall, and a second step which produces a tapered sidewall along lower portions of the vertical sidewall.

24 Claims, 1 Drawing Sheet

METHOD FOR REDUCING STRESS IN THE METALLIZATION OF AN INTEGRATED CIRCUIT

TECHNICAL FIELD

The present invention is generally directed to the manufacture of integrated circuits and, in particular, to the prevention of cracking in the final passivation layer of an integrated circuit by reducing stress in the surrounding dielectrics.

BACKGROUND OF THE INVENTION

Current metal patterning methods, including reactive ion etching (RIE) and damascene techniques, use anisotropic etching processes that make it possible to produce patterns having features with dimensions on the order of sub-half micron in size. In practice, such anisotropic etching results in the development of sharp corners (i.e., when viewed through the cross-section of the metal layer).

For example, FIGS. 1A and 1B schematically illustrate integrated circuits 1, 2 which have been produced using an RIE process (FIG. 1A) and a damascene process (FIG. 1B), respectively. In each case, desired metallized features 3 (e.g., conductor lines formed of aluminum) are shown associated with a suitable substrate 4 (e.g., formed of $SiO_2$). For the RIE-prepared integrated circuit 1 of FIG. 1A, an outer layer 5 (e.g., including $Si_3N_4$ and $SiO_2$) is applied over the features 3 and the substrate 4. For the damascene-prepared integrated circuit 2 of FIG. 1B, the metallized features 3 are received within trenches 6 formed in the substrate 4.

In practice, such processing results in sharp corners 7', 7" (seen through the cross-section of the metallized features 3), respectively, along the tops 8 and at the bottoms 9 of the metallized features 3. The sharp corners 7', 7" tend to cause high stresses in the surrounding dielectrics. These high stresses have been found to cause cracks in the final passivation layer. S. Lee & K. Lee, "The Optimization of Passivation Layout Structure for Reliability Improvement of Memory Devices," Jpn. J. Appl. Phys., Vol. 35, Part 1, No. 10, pp. 5462–65 (October 1996). These high stresses have also been found to cause "cratering" in the fuses which have come to be formed on integrated circuits for various purposes, when such fuses are laser-blown.

In an effort to reduce stress-induced cracking, Lee et al. suggest increasing the passivation thickness. The authors recognize, however, that the beneficial effects of this suggestion are limited by a corresponding increase in the brittleness of a thicker layer. U.S. Pat. Nos. 5,416,048; 4,425,183; and 4,352,724 each suggest rounding of the top corners 7' to achieve various improvements in the etching of semiconductors. For U.S. Pat. Nos. 5,416,048 and 4,425,183, and as is further disclosed in U.S. Pat. No. 4,780,429, the etched metallized features 3 can further be provided with sloping sides to achieve various other improvements. The sloping sides resulting from such manufacturing processes are formed, however, using the oxides of the metals which form the metallized features 3. Such formation has been found to yield moderately high leakage currents and, at times, to extend across the gap which must be preserved between the adjacent metallized features 3 (e.g., adjacent metal vias or lines).

Therefore, the primary object of the present invention is to reduce deleterious effects, such as cracking of the final passivation layer or "cratering" of the fuse layer of a manufactured integrated circuit, by reducing the high stresses which can be developed in the dielectrics which surround the features being formed on the integrated circuit. Another object of the present invention is to accomplish this in a way which is fully compatible with conventional metal patterning methods, including RIE and damascene techniques.

SUMMARY OF THE INVENTION

These and other objects, which will become apparent, are achieved in accordance with the present invention by rounding bottom corners of the features formed as part of an integrated circuit, such as the "interconnects" of the integrated circuit, before applying the outer (i.e., passivation) layer.

In connection with the formation of metal lines patterned by a metal RIE process, such corner rounding can be achieved using a two-step metal etching process including a first step which produces a vertical sidewall and a second step which tapers lower portions of the vertical sidewall. This process results in a rounded bottom corner which improves the step coverage of the overlying dielectric, in turn eliminating the potential for cracks. Such corner rounding can also be achieved by producing a tapered insulating sidewall along the feature (i.e., the metal line or via) by applying a flowable glass (such as a spin-on-glass) layer to lower portions of the feature, followed by etching of the applied glass layer to form a spacer. This process results in a bottom corner having a sidewall formed from the flowable glass which is tapered, rather than vertical, again improving the step coverage of the overlying dielectric.

For metal lines patterned by damascene, such corner rounding can be achieved using a two-step trench etching process including a first step which produces a vertical sidewall, and a second step which produces a tapered sidewall along lower portions of the vertical sidewall.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not drawn to scale. On the contrary, the dimensions of the various features are arbitrarily expanded or reduced for clarity. Included in the drawing are the following figures.

DETAILED DESCRIPTION OF PREFERRED EMBODIMENTS

In accordance with the present invention, it has been found that the stresses commonly induced in the dielectrics of integrated circuits manufactured using metal patterning methods, including reactive ion etching (RIE) and damascene techniques, can be reduced by rounding the lower corners associated with the features which are formed as part of the integrated circuit (e.g., the interconnects of the integrated circuit) before applying the outer (i.e., passivation) layer. Such corner rounding can be achieved in any of a number of ways, and the processes used to accomplish corner rounding in accordance with the present invention may be freely varied responsive to the specifics of the manufacturing process which is being used to form a particular integrated circuit, the topology of the integrated circuit which is being formed, the materials forming the various elements of the integrated circuit, or such other variables as may pertain to the specific manufacturing process being performed. Examples of these processes are given below, with the understanding that the several embodiments to be described are given only as examples of the many equivalents which may implement the improvements of the present invention.

Figure 1A:
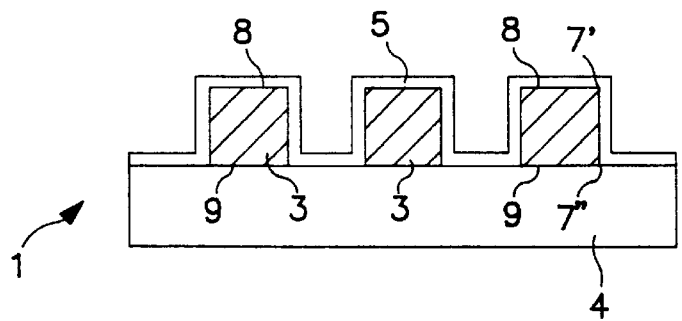
FIG. 1A is a schematic cross-sectional view of an integrated circuit having features produced using known reactive ion etching techniques.
Figure 1B:
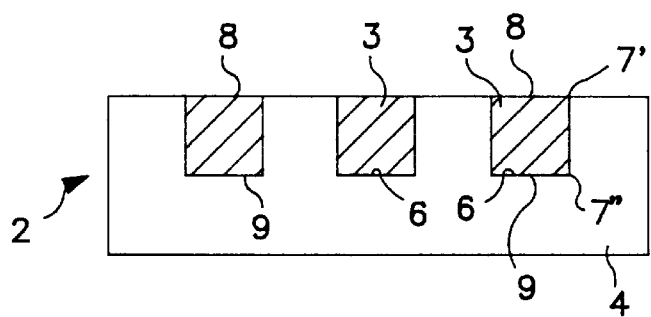
FIG. 1B is a schematic cross-sectional view of an integrated circuit having features produced using known damascene etching techniques.
Figure 2:
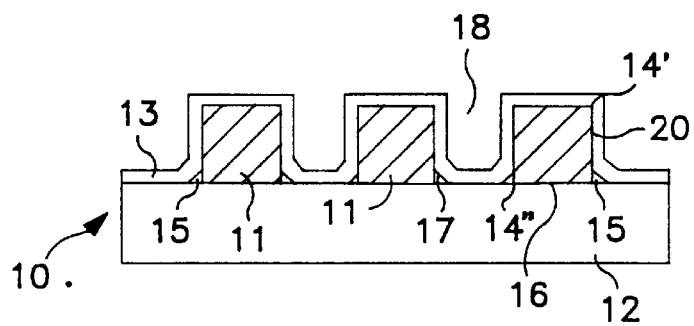
FIG. 2 is a schematic cross-sectional view similar to FIG. 1A, showing the manufacture of an integrated circuit having features produced in accordance with a first embodiment of the method of the present invention.

FIG. 2 shows an integrated circuit 10 which is produced using a metal RIE process. The integrated circuit 10 is formed with desired features, which in the embodiment illustrated include a plurality of conductor lines 11 formed of aluminum. The conductor lines 11 are formed on a suitable substrate 12, which may be formed of $SiO_2$. An outer layer 13 (e.g., including $Si_3N_4$ and $SiO_2$) is applied over the conductor lines 11 and the substrate 12. As previously discussed, using conventional RIE processing to manufacture the integrated circuit 10 would ordinarily result in sharp corners, shown in the view taken through the cross-section of the conductor lines 11, at 14' and 14".

In accordance with the present invention, however, the corners 14" have been rounded by forming beveled $SiO_2$ spacers 15 where the conductor lines 11 meet the substrate 12. The spacers 15 can be obtained by first applying a spin-on-glass (SOG), or other flowable material, along the bottom portions 16 of the conductor lines 11, and by then etching back the applied material to form the desired spacers 15. A spacer 15 formed from a flowable material, for example, by an anisotropic etch such as fluorine-based RIE, will tend to exhibit a taper (shown at 17) rather than being vertical, as is the case for conventional spacers. As a result, the flowable material will tend to produce a "U-shaped" profile in the outer layer 13 (between the conductor lines 11), rather than the square profile which would result from the conforming (deposited) materials traditionally used to produce spacers.

A thin layer (e.g., 25 to 250 nm) of the flowable material is preferably used in forming the spacer 15 so that the resulting structure only partially fills the space (the gap 18) between adjacent interconnects. Forming the narrowest possible spacer 15 is preferred to minimize potentially adverse effects, such as leakage currents extending across the gap 18, when spacer 15 is a conductor. The spin-on-material either can form part of the permanent structure (i.e., for a spin-on-glass) or can be a disposable layer (i.e., a polymer, $B_2O_3$, and the like) which is used to transfer the rounded shape into an underlying film (such as plasma-enhanced chemical vapor deposited $SiO_2$).

The corners 14" where the conductor lines 11 meet the substrate 12 can also be rounded by operating upon the metal which forms the conductor lines 11. For example, referring to FIG. 3, RIE can be used to taper the conductor lines 11 to form a beveled region 19 which is integral with the remainder of the feature 3. In accordance with the present invention, however, such etching is limited to the bottom portions 16 of the conductor lines 11 (i.e., near the end of the etch) to minimize potentially adverse effects such as leakage currents extending across the gap 18.

Figure 3:
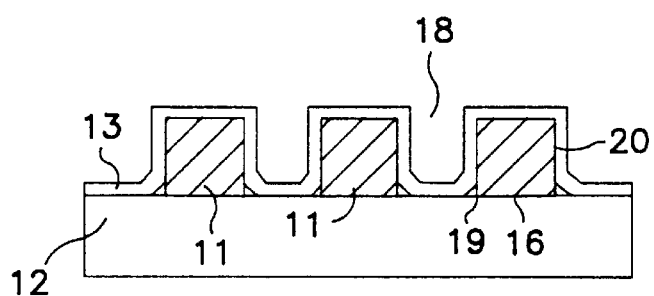
FIG. 3 is a schematic cross-sectional view similar to FIG. 1A, showing the manufacture of an integrated circuit having features produced in accordance with a second, alternative embodiment of the method of the present invention.

The metal profile shown in FIG. 3 can be achieved using a two-step RIE process. The first step of the process uses a chlorine-based etch to produce a vertical profile in upper portions 20 (e.g., the upper 50% to 90% of the final, total height) of the conductor lines 11. The second step uses a modified chlorine-based etch to produce an increased amount of etch by-products on the vertical sidewall, developing the beveled region 19 along the bottom portions 16 of the conductor lines 11. One way to achieve such a beveled region 19 is to reduce the bias voltage or power applied during the second step of the etching process. It is presently believed that this would be easiest to implement by tapering the lower layers of a multi-layer stack (such as titanium or TiN refractory metals underneath an aluminum layer). In such case, the first step would etch completely through the aluminum layer, but would be caused to stop on the refractory metal underlayer. The second step would etch the refractory metal underlayer, producing a taper in the underlayer (or underlayers).

Figure 4:
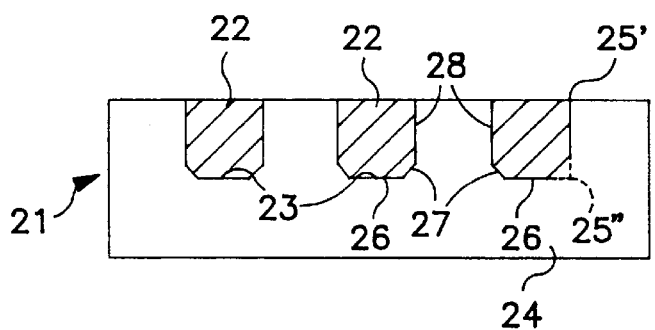
FIG. 4 is a schematic cross-sectional view similar to FIG. 1B, showing the manufacture of an integrated circuit having features produced in accordance with the present invention.

FIG. 4 shows an integrated circuit 21 which is produced using a damascene process. The integrated circuit 21 is formed with desired features, which in the embodiment illustrated again include a plurality of conductor lines 22 formed of aluminum. The conductor lines 22 are received in a series of trenches 23 created in a suitable substrate 24. The substrate 24 may be formed, for example, of $SiO_2$. As previously discussed, conventional damascene processing used to manufacture the integrated circuit 21 would ordinarily result in sharp corners, shown in the view taken through the cross-section of the conductor lines 22, at 25' and 25". In accordance with the present invention, however, the bottom portions 26 of the trenches 23 have been tapered, forming beveled regions 27 for rounding the corners 25" of the metal damascene conductor lines 22.

Such corner rounding can be achieved using a two-step etching process. The first step of the process uses a non-polymerizing, fluorine-based, dry etch to form vertical sidewalls in upper portions 28 (e.g., the upper 50% to 90% of the final, total depth) of the trench 23. The second step uses a polymerizing dry etch to taper the bottom of the trench 23, forming the beveled regions 27 along the bottom portions 26 of the trench 23. Alternatively, the second step could be an isotropic wet or dry etch to round the bottom portions 26 of the trench 23. This alternative second step would tend to cause widening at the top of the trench 23, however, which may be undesirable for some applications.

The embodiments described above, and the several methods described for implementing such embodiments, provide a practical way to reduce the stress in dielectrics that surround the interconnects of an integrated circuit construction. As previously indicated, however, such embodiments are given only as examples of the many circuit constructions and processing steps which can be used to implement an integrated circuit in accordance with the present invention. Therefore, it will be understood that various changes in the details, materials, and arrangement of parts which have been described and illustrated in order to explain the nature of the present invention may be made by those skilled in the art within the principles and scope of the invention as expressed in the following claims.

What is claimed:

1. A method for manufacturing an integrated circuit including a substrate and an interconnect formed on the substrate by an etching process, wherein the etching process comprises the steps of forming the interconnect with substantially vertical sidewalls extending between top portions of the interconnect and bottom portions of the interconnect, in a first step of the etching process, and forming a rounded corner portion along the bottom portions of the interconnect using a polymerizing dry etch, in a second step of the etching process.

2. The method of claim 1 wherein the etching process is an anisotropic etching process.

3. The method of claim 2 wherein the etching process is a reactive ion etching process.

4. The method of claim 2 wherein the etching process is a damascene etching process.

5. The method of claim 1 which further includes the step of applying a passivation layer over the interconnect and the substrate after forming the rounded corner portion, whereby the rounded corner portion reduces stress in the passivation layer.

6. The method of claim 1 wherein the rounded corner portion is formed only along the bottom portions of the interconnect.

7. The method of claim 1 wherein the rounded corner portion is formed as a bevel along the bottom portions of the interconnect.

8. The method of claim 7 wherein the second step includes forming the bevel as an integral part of the interconnect.

9. The method of claim 8 wherein the bevel is formed with a reactive ion etch.

10. The method of claim 7 which further includes the step of forming the bevel by tapering lower layers of a multi-layer stack.

11. The method of claim 1 wherein the feature is formed within a damascene trench.

12. The method of claim 11 wherein the first step is performed with a non-polymerizing, fluorine-based, dry etch.

13. The method of claim 12 wherein the first step produces a substantially vertical profile in only an upper 50% to 90% of the sidewalls of the trench.

14. The method of claim 1 wherein the second step is an isotropic etch.

15. The method of claim 1 wherein the first step produces a substantially vertical profile in only an upper 50% to 90% of the sidewalls of the interconnect.

16. The method of claim 1 wherein the first step of the etching process produces a gap between the vertical sidewalls of adjacent interconnects, thereby establishing an open region between the adjacent interconnects, and wherein the second step of the etching process forms the rounded corner portion within the open region established between the adjacent interconnects.

17. A method for manufacturing an integrated circuit including a substrate and an interconnect formed on the substrate by an etching process, wherein the etching process comprises the steps of forming the interconnect with substantially vertical sidewalls extending between top portions of the interconnect and bottom portions of the interconnect, in a first step of the etching process, thereby defining a gap between the vertical sidewalls which establishes an open region between adjacent interconnects, and forming a rounded corner portion along the bottom portions of the interconnect, in a second step of the etching process, by forming a spacer along the bottom portions of the interconnect and within the open region established between the adjacent interconnects.

18. The method of claim 17 which further includes the step of applying a passivation layer over the interconnect and the substrate after forming the rounded corner portion, whereby the rounded corner portion reduces stress in the passivation layer.

19. The method of claim 17 wherein the rounded corner portion is formed only along the bottom portions of the interconnect.

20. The method of claim 17 wherein the first step produces a substantially vertical profile in only an upper 50% to 90% of the sidewalls of the interconnect.

21. The method of claim 17 wherein the spacer is formed by applying a flowable insulating material to the bottom portions of the interconnect, and etching back the flowable insulating material to form the spacer.

22. The method of claim 21 wherein the etching back is performed with an anisotropic etch.

23. The method of claim 22 wherein the anisotropic etch is a fluorine-based reactive ion etch.

24. The method of claim 21 wherein the flowable insulating material is applied in a thickness of from 25 to 250 nm.

* * * * *

UNITED STATES PATENT AND TRADE MARK OFFICE
CERTIFICATE OF CORRECTION

PATENT NO. : 5,939,335
DATED : August 17, 1999
INVENTOR(S) : Arndt et al.

It is certified that error appears in the above-identified patent and that said Letters Patent is hereby corrected as shown below:

On the title page, item
[56] References Cited, Other Publications, insert the following:

-- S. Lee & K. Lee, "The Optimization of Passivation Layout Structure for Reliability Improvement of Devices," Jpn. J. Appl. Phys., vol. 35, Part 1, No. 10, pp. 5462-65 (Oct. 1996) --.

Signed and Sealed this

Eleventh Day of April, 2000

*Attest:*

Q. TODD DICKINSON

*Attesting Officer*     *Director of Patents and Trademarks*